(12) United States Patent
Chen

(10) Patent No.: US 11,373,943 B2
(45) Date of Patent: Jun. 28, 2022

(54) FLIP-CHIP FILM

(71) Applicant: WUHAN CHINA STAR OPTOELECTRONICS SEMICONDUCTOR DISPLAY TECHNOLOGY CO., LTD., Hubei (CN)

(72) Inventor: Yicheng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 126 days.

(21) Appl. No.: 16/966,124

(22) PCT Filed: Jun. 19, 2020

(86) PCT No.: PCT/CN2020/097013
§ 371 (c)(1),
(2) Date: Jul. 30, 2020

(87) PCT Pub. No.: WO2021/223294
PCT Pub. Date: Nov. 11, 2021

(65) Prior Publication Data
US 2021/0351119 A1    Nov. 11, 2021

(51) Int. Cl.
*H01L 23/498* (2006.01)
*H01L 27/15* (2006.01)
*H01L 23/12* (2006.01)

(52) U.S. Cl.
CPC .... *H01L 23/49838* (2013.01); *H01L 23/4985* (2013.01); *H01L 27/156* (2013.01); *H01L 23/12* (2013.01)

(58) Field of Classification Search
CPC ................ H01L 23/49838; H01L 23/4985
See application file for complete search history.

(56) References Cited

U.S. PATENT DOCUMENTS

| | | | |
|---|---|---|---|
| 6,495,768 B1 | 12/2002 | Cho | |
| 2014/0054793 A1* | 2/2014 | Ha | H01L 23/4985 257/774 |
| 2015/0076531 A1* | 3/2015 | Kim | H01L 27/156 257/774 |

FOREIGN PATENT DOCUMENTS

| | | |
|---|---|---|
| CN | 101064261 A | 10/2007 |
| CN | 103066047 A | 4/2013 |
| CN | 103337490 A | 10/2013 |
| CN | 110634833 A | 12/2019 |

* cited by examiner

*Primary Examiner* — Ahmed N Sefer
(74) *Attorney, Agent, or Firm* — Mark M. Friedman

(57) ABSTRACT

A flip-chip film includes a substrate and a plurality of flip-chip film units. The plurality of flip-chip film units are disposed on the substrate, and each of the flip-chip film units includes a plurality of first metal traces arranged at intervals. A punch cut is defined between the first metal traces of two adjacent flip-chip film units.

16 Claims, 3 Drawing Sheets

FLIP-CHIP FILM

BACKGROUND OF INVENTION

Field of Invention

The present invention relates to the field of display technology, and more particularly, to a flip-chip film.

Description of Prior Art

Currently, narrow frame display products, such as mobile phones, have gradually become the mainstream marketing trend. In order to meet the market application requirements, display panels in display products usually need to use chip on film (COF) technology to meet the requirements of narrow frame display products.

Due to narrow spacing of metal traces on the COF substrate, when punching a COF die-cutting area, some metal debris may remain on the edges of some of the metal traces in the die-cutting area. When a die-cut COF press-bonding area and a display panel binding area are press-bonded together, the metal debris remaining on the edge of the metal traces increases risk of short-circuiting between the metal traces in the COF press-bonding area, which may cause product malfunction.

SUMMARY OF INVENTION

A flip-chip film is provided to reduce the risk of short-circuiting between traces in the press-bonding area of chip on film (COF) after bonding.

A flip-chip film comprises:
a substrate;
a plurality of flip-chip film units, wherein the plurality of flip-chip film units are disposed on the substrate, and each of the flip-chip film units comprises a plurality of first metal traces arranged at intervals; and
a punch cut defined between the first metal traces of two adjacent flip-chip film units, wherein a plurality of punch cuts are connected with each other and arranged side by side, and the substrate is a flexible substrate.

In one embodiment, each of the flip-chip film units further comprises at least two second metal traces, the second metal traces and the first metal traces are disposed side by side, and at least one of the first metal traces is disposed between two adjacent second metal traces in each of the flip-chip film units, and the second metal traces between the two adjacent flip-chip film units are correspondingly connected one to one.

In one embodiment, the first metal traces and the second metal traces are alternately disposed in each of the flip-chip film units.

In one embodiment, the plurality of first metal traces are disposed between the two adjacent second metal traces in each of the flip-chip film units.

In one embodiment, each of the flip-chip film units further comprises a second metal trace, the second metal trace and the first metal trace are disposed side by side, and a plurality of second metal traces are correspondingly connected to each other between the two adjacent flip-chip film units.

In one embodiment, a length of the punch cut ranges from 250 microns to 400 microns in an extending direction of the first metal trace.

In one embodiment, a cutting line is defined on the substrate corresponding to a portion of the punch cut, the cutting line is perpendicular to the extending direction of the first metal trace, and in a direction parallel to an extending direction of the first metal trace, distances from the cutting line to the first metal traces of the two adjacent flip-chip film units are equal.

In one embodiment, each of the flip-chip film units further comprises a driving chip, a plurality of connection terminals are disposed on the driving chip, and the plurality of connection terminals are correspondingly and electrically connected to each end of the first metal traces.

A flip-chip film comprises:
a substrate;
a plurality of flip-chip film units, and the plurality of flip-chip film units are disposed on the substrate, and each of the flip-chip film units comprises a plurality of first metal traces arranged at intervals; and
a punch cut defined between the first metal traces of two adjacent flip-chip film units.

In one embodiment, a plurality of punch cuts are connected with each other and arranged side by side.

In one embodiment, each of the flip-chip film units further comprises at least two second metal traces, the second metal traces and the first metal traces are disposed side by side, and at least one of the first metal traces is disposed between two adjacent second metal traces in each of the flip-chip film units, and the second metal traces between the two adjacent flip-chip units are correspondingly connected one to one.

In one embodiment, the first metal traces and the second metal traces are alternately disposed in each of the flip-chip film units.

In one embodiment, the plurality of first metal traces are disposed between the two adjacent second metal traces in each of the flip-chip film units.

In one embodiment, each of the flip-chip film units further comprises a second metal trace, the second metal trace and the first metal trace are disposed side by side, and a plurality of second metal traces are correspondingly connected to each other between the two adjacent flip-chip film units.

In one embodiment, a length of the punch cut ranges from 250 microns to 400 microns in an extending direction of the first metal trace.

In one embodiment, a cutting line is defined on the substrate corresponding to a portion of the punch cut, the cutting line is perpendicular to the extending direction of the first metal trace, and in a direction parallel to the extending direction of the first metal trace, distances from the cutting line to the first metal traces of the two adjacent flip-chip film units are equal.

In one embodiment, each of the flip-chip film units further comprises a driving chip, a plurality of connection terminals are disposed on the driving chip, and the plurality of connection terminals are correspondingly and electrically connected to each end of the first metal traces.

In one embodiment, the substrate is a flexible substrate.

Compared with the flip-chip film in the prior art, the flip-chip film of the present invention is provided with a punch cut between the first metal traces of the two adjacent flip-chip film units. The punch cut cuts off the corresponding first metal traces between two adjacent flip-chip film units. Therefore, when cutting the die-cutting area of the flip-chip film, there is no metal trace at a position corresponding to the punch cut of the flip-chip film, and the generation probability of metal debris during the punching process can be reduced, thereby reducing the risk of short-circuiting between the metal traces in the press-bonding area after the bonding of the flip-chip film units, and improving the reliability of the products.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

DETAILED DESCRIPTION OF PREFERRED EMBODIMENTS

Figure 1:
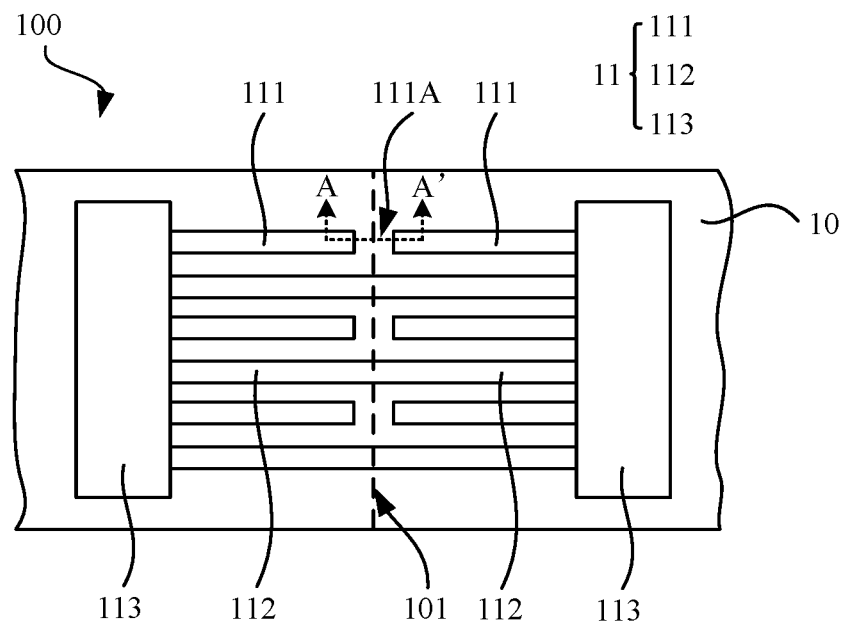
FIG. 1 is a schematic structural view of a flip-chip film according to first embodiment of the present invention.

The embodiments of the present invention are described in detail below, and the examples of the embodiments are illustrated in the drawings, in which the same or similar reference numerals indicate the same or similar elements or elements having the same or similar functions. The embodiments described below with reference to the drawings are used to understand the present invention, but are not to be as limiting.

In the description of the present invention, it is to be understood that the terms "center," "longitudinal," "lateral," "length," "width," "thickness," "upper," "lower," "front," "back," "left," "right," "vertical," "horizontal," "top," "bottom," "inside," "outside," "clockwise," "counterclockwise," etc., indicated as orientation or positional relationship are based on the orientation or positional relationship shown in the drawings, they merely intend to illustrate the present invention and simplify the description, but are not to be as indicating or implying specific devices or elements having specific orientation, specific orientation structure and operating. Therefore, it cannot be understood as limitations. Moreover, the terms "first" and "second" are merely used for describing purposes, but are not to be conceived as indicating or implying a relative important or implicitly indicating specific technical feature numbers. Accordingly, the feature limitations of "first" or "second" may include one or more of the described features explicitly or implicitly. In the description of the present invention, the meaning of "a plurality of" is two or more, unless otherwise explicitly defined.

In the description of the present invention, it should be noted that, unless otherwise explicitly defined, the terms "installation," "adjacent," and "connection" are to be understood broadly, for example, it may be fixed connection, disassembly connection or integral connection; it may be mechanical connection, electrically connection or interconnection; it may be directly connection or indirectly connected through an intermediate medium; and it may be interconnection of two elements or interaction of two elements. A person skilled in the art can conceive the specific meanings of the above-mentioned terms in the present invention based on the specific situation.

In the present invention, unless otherwise specifically defined and defined, the first feature is disposed "on" or "under" the second feature, which means that the first feature directly contacts the second feature, and also the first feature is not in direct contact the second feature but through addition features between them. Moreover, the first feature is disposed "above," "on," and "upper" the second feature, which means that the first feature is directly or substantially above the second feature, or merely indicates that the first feature level is higher than the second feature. The first feature is "below," "under" and "underneath" the second feature, which means that the first feature is directly or substantially below the second feature, or merely indicates that the first feature level is less than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the invention. In addition, the present invention may be repeated with reference numerals in the various examples, which are for the purpose of simplicity and clarity, and do not indicate the relationship between the various embodiments and/or arrangements discussed. Moreover, the present invention provides embodiments of various specific processes and materials, but a person skilled in the art may recognize the use of other processes and/or the use of other materials.

It should be noted that the flip-chip film in the present invention includes a plurality of flip-chip film units. The following embodiments of the present invention only use the structure of two adjacent flip-chip film units as an example for description, but are not limited thereto.

It should be noted that the specific structure and connection relationship between the first metal trace, or the first metal trace and the second metal trace, and the driving chip of the flip-chip film unit in the present invention are only for illustration, so as to facilitate the description of following embodiments of the present invention, but it cannot be understood as a limitation to the present invention.

In addition, for the convenience of describing the following embodiments of the present invention, the present invention only illustrates a portion of the first metal trace, or a portion of the first metal trace and a portion of the second metal trace, in the flip-chip film unit, but it is not limited thereto.

Figure 2:
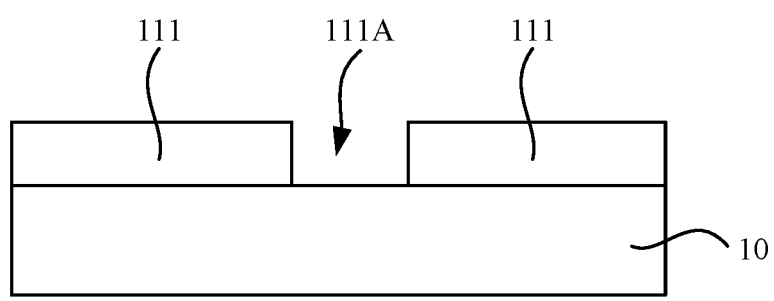
FIG. 2 is a schematic structural view of the cross-sectional structure along line AA' in FIG. 1.

Referring to FIG. 1 and FIG. 2, FIG. 1 is a schematic structural view of a flip-chip film according to first embodiment of the present invention. FIG. 2 is a schematic structural view of the cross-sectional structure along line AA' in FIG. 1.

In first embodiment, a flip-chip film 100 includes a substrate 10 and a plurality of flip-chip film units 11. The plurality of flip-chip film units 11 are disposed on the substrate 10, and each of the flip-chip film units 11 includes a plurality of first metal traces 111 arranged at intervals and at least two second metal traces 112. The second metal traces 112 and the first metal traces 111 are disposed side by side. A die-cut notch 111A is defined between the first metal traces 111 of two adjacent flip-chip film units 11. at least one of the first metal traces 111 is disposed between two adjacent second metal traces 112 in each of the flip-chip film units. The second metal traces 112 between the two adjacent flip-chip film units 11 are correspondingly connected one to one.

Therefore, the flip-chip film 100 provided in the first embodiment is provided with the punch cut 111A between the first metal traces 111 of the two adjacent flip-chip film units 11. The punch cut 111A cuts off the corresponding first metal traces 111 between two adjacent flip-chip film units 11. Therefore, when cutting the die-cutting area of the flip-chip film 100, there is no metal trace at a position corresponding to the punch cut 111A of the flip-chip film 100, and a probability of metal debris generation during the punching process can be reduced, thereby reducing the risk of short-circuiting between the metal traces in a press-bonding area after the bonding of the flip-chip film units 11, and improving the reliability of the products.

Specifically, the substrate 10 is a flexible substrate. The material of the flexible substrate may be a flexible material such as polyimide. In some embodiments, the substrate 10 may also be a hard substrate, and the material of the substrate is not specifically limited herein.

In the first embodiment, a laser cutting process is used to remove metal traces between two adjacent flip-chip film units to form the punch cut 111A. The specific method of defining the punch cut 111A is not specifically limited herein.

It should be noted that the number of the second metal traces 112 in the first embodiment of the present invention may be set to two, three, or more than three, which is not limited herein.

Specifically, in the first embodiment, the first metal traces 111 and the second metal traces 112 are alternately disposed in each of the flip-chip film units 11.

Accordingly, a first metal trace 111 is disposed between two adjacent second metal traces 112, and a punch cut 111A is defined between the first metal traces corresponding to the two adjacent flip-chip film units 11. Therefore, generation of metal debris between two adjacent second metal traces 112 in the flip-chip film unit 11 is reduced in the die-cutting process, and the risk of short-circuiting between the metal traces in the press-bonding area after the bonding of the flip-chip film units 11 is reduced.

It can be understood that when a die-cutting tool is used to cut the portion of the flip-chip film 100 in the die-cutting area, the substrate 10 is directly exposed because there is no metal trace in the punch cut 111A of the die-cutting area. Therefore, it is only necessary to directly cut the exposed portion of the substrate 10 so as to reduce the generation probability of metal debris during the punching process.

Furthermore, in the first embodiment, a cut line 101 is defined on a portion of the substrate 10 corresponding to the punch cut 111A. The cutting line 101 is perpendicular to the extending direction of the first metal trace 111. In a direction parallel to the extending direction of the first metal trace 111, distances from the cutting line 101 to the first metal traces 111 of the two adjacent flip-chip film units 11 are equal.

It can be understood that, in a direction perpendicular to the extending direction of the first metal trace 111, the cutting line 101 penetrates the portion of the second metal trace 112 corresponding to the punch cut 111A.

The above-mentioned arrangement makes the distances from the cutting line 101 to the first metal traces 111 of the two adjacent flip-chip film units 11 equal, so that it effectively avoids the generation of metal debris on a side of the first metal trace 111 due to the small distances between the cutting line 101 and the first metal trace 111. Therefore, the probability of metal debris generation in the punching process can be further reduced. In addition, this arrangement can also improve the alignment accuracy between the flip-chip film 100 and die-cutting tool, thereby further improving the punching yield of the product.

Furthermore, a length of the punch cut 111A ranges from 250 microns to 400 microns in an extending direction of the first metal trace 111.

It can be understood that after the flip-chip film unit 11 is die-cut from the flip-chip film 100, the ends of the first metal trace 111 and the second metal trace 112 close to the die-cutting area are used as the press-bonding area, and the wiring of the press-bonding area is used for press-bonding with the wiring in the binding area of the display panel to be bound.

It should be noted that a wiring length of the press-bonding area of the flip-chip film unit 11 can be set according to actual needs, and will not be described herein.

The binding area of the display panel includes circuits corresponding to the first metal trace 111 and the second metal trace 112, so when the opening length of the punch cut 111A is between 250 microns and 400 microns, it can also effectively prevent the exposed portion of the traces of the binding area of the display panel from being short-circuited or damaged due to contact with other circuits under the premise of ensuring that the probability of metal debris is reduced during the punching process, thereby ensuring the stability of the wiring of the display panel binding area, and further improving the reliability of the display product.

Specifically, the length of the punch cut 111A may be 250 microns, 300 microns, 350 microns, or 400 microns. The specific length of the punch cut 111A may be set according to the needs of the actual product and the wiring in the binding area of the display panel, which is not limited herein.

Furthermore, in first embodiment, a side of the first metal trace 111 facing the punch cut 111A is a plane, which is perpendicular to the plane where the substrate 10 is located, as shown in FIG. 2. In addition, the side of the first metal trace 111 facing the punch cut 111A may also be a curved surface, and the structure of the side of the first metal trace 111 facing the punch cut 111A is not specifically limited herein.

In first embodiment, each of the flip-chip film units 11 further includes a driving chip 113, a plurality of connection terminals (not shown) are disposed on the driving chip 113, and the plurality of connection terminals are electrically connected one-to-one with ends of the first metal traces 112 and ends of the second metal traces 112 one to one.

It should be noted that the connection terminals in the driving chip 113 connected to the first metal trace 111 and the second metal trace 112 may refer to the prior art, and not be described herein.

In the flip-chip film 100 provided in the first embodiment of the present invention, by disposing the first metal traces 111 and the second metal traces 112 alternately in each flip-chip film unit 11, a first metal trace is disposed between two adjacent second metal traces 112. Since the first metal traces 111 corresponding to the two adjacent flip chip units 11 are provided with a punch cut 111A, the generation of metal debris between the two adjacent second metal traces 112 in the flip-chip film unit 11 is reduced during the die cutting process, thereby reducing the risk of short-circuiting between the metal traces in the press-bonding area after binding the flip-chip film unit 11, and improving the reliability of the product.

Figure 3:
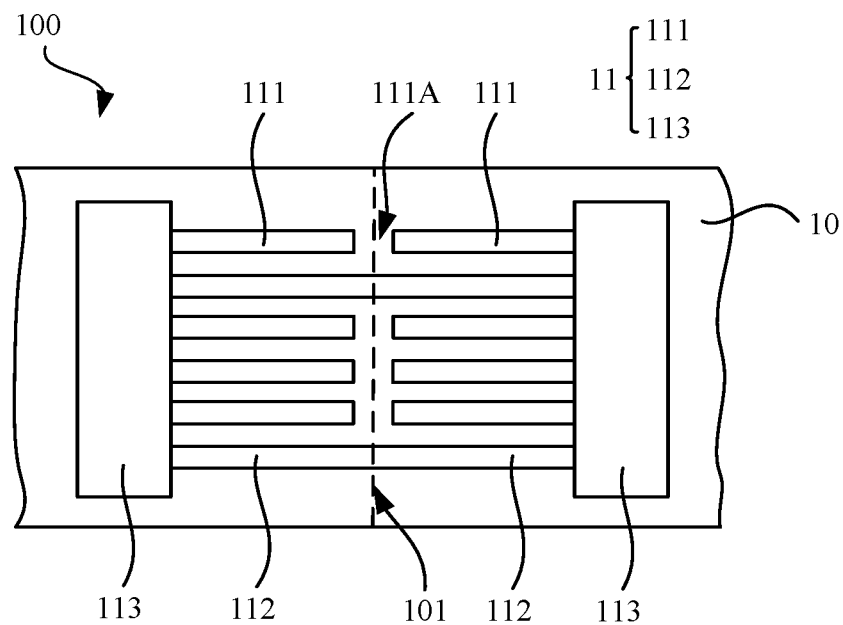
FIG. 3 is a schematic structural view of a flip-chip film according to second embodiment of the present invention.

Referring to FIG. 3, it is a schematic structural view of a flip-chip film according to second embodiment of the present invention. The difference between the second embodiment and the first embodiment is that that in each flip-chip film unit 11, a plurality of first metal traces 111 are disposed between two adjacent second metal traces 112.

In the second embodiment, since the corresponding first metal traces 111 between two adjacent flip-chip film units 11 are provided with a punch cut 111A, the number of first metal traces 111 between two adjacent second metal traces 112 in the flip-chip film unit 11 is increased, thereby increasing the number of punch cuts 111A in the die-cutting area on the flip-chip film 100, and when a die-cutting tool is used to cut the portion of the flip-chip film 100 located in the die-cutting area, the generation of metal debris on the edge of the wiring in the die-cutting area is reduced, thereby reducing the risk of short-circuiting between the metal traces in the press-bonding area after the bonding of the flip-chip film units 11.

It should be noted that, in the second embodiment, three first metal traces 111 are disposed between two adjacent second metal traces 112. In some embodiments, two or more first metal traces 111 may be disposed between two adjacent second metal traces 112, and not be described herein.

Figure 4:
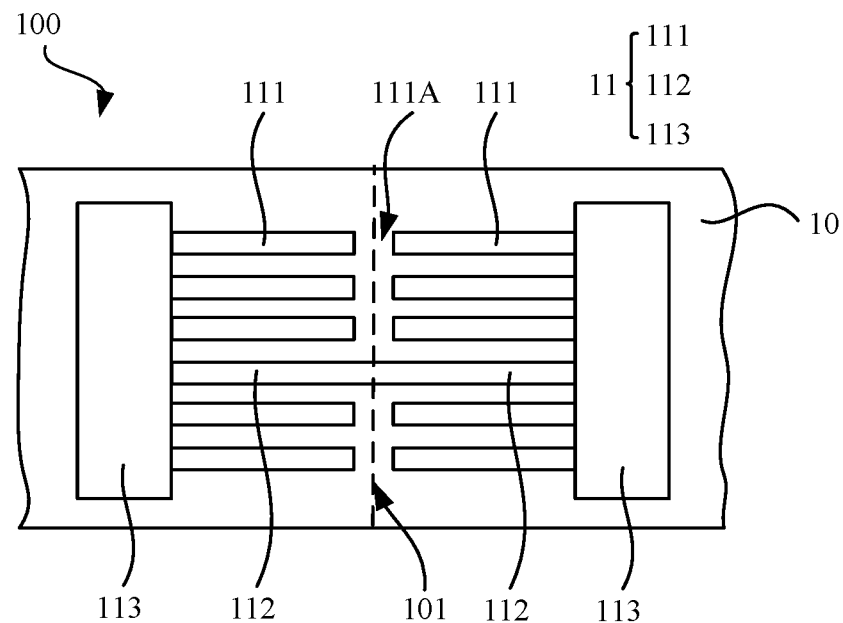
FIG. 4 is a schematic structural view of a flip-chip film according to third embodiment of the present invention.

Referring to FIG. 4, it is a schematic structural view of a flip-chip film according to a third embodiment of the present invention. The difference between the third embodiment and the first embodiment is that each of the flip-chip film units 11 includes one second metal trace 112, the second metal trace 112 and the first metal trace 111 are disposed side by side, and a plurality of second metal traces 112 are correspondingly connected to each other between the two adjacent flip-chip film units 11.

Specifically, punch cuts 111A of a plurality of first metal traces 111 on the side of the second metal wires 112 in the adjacent flip-chip thin film units 11 are connected to each other and arranged side by side.

Specifically, in the adjacent flip-chip thin film units 11, a plurality of punch cuts 111A of the first metal traces 111 disposed on a side of the second metal traces 112 are connected with each other and arranged side by side.

In third embodiment, by retaining only one second metal trace 112 in each flip-chip film unit 11, the number of punch cuts 111A in the die-cutting area on the flip-chip film 100 is greatly increased. Therefore, the probability of generating metal debris on the edge of the wiring in the punching area is greatly reduced, and the risk of short-circuiting between the metal traces in the press-bonding area after binding the flip-chip film unit 11 is reduced.

Figure 5:
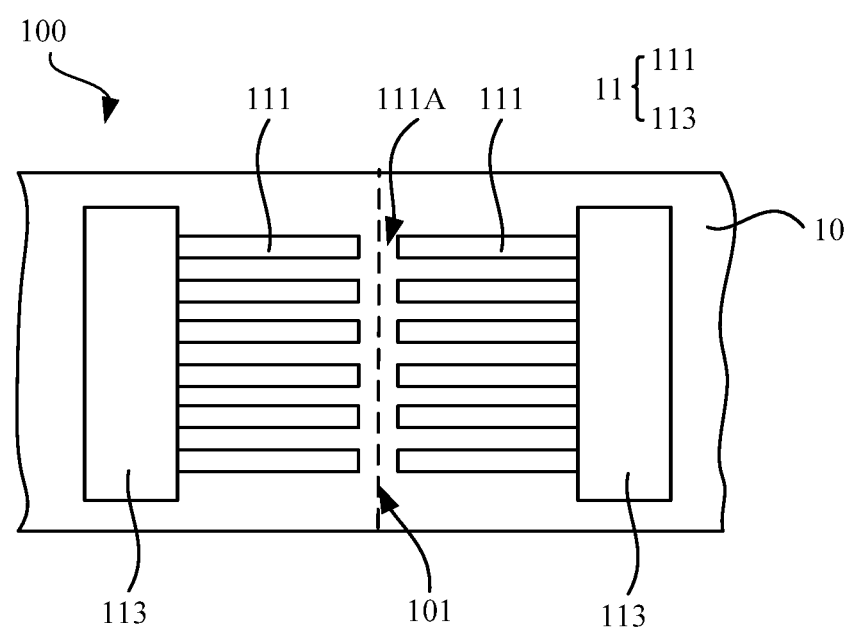
FIG. 5 is a schematic structural view of a flip-chip film according to fourth embodiment of the present invention.

Referring to FIG. 5, it is a schematic structural view of a flip-chip film according to fourth embodiment of the present invention. The difference between the fourth embodiment and the first embodiment is that the plurality of punch cuts 111A are connected with each other and arranged side by side.

Specifically, in the fourth embodiment, each flip-chip film unit 11 merely includes first metal traces 111. The punch cut 111A is defined between the corresponding first metal traces 111 of the adjacent flip chip units 11.

In the fourth embodiment, the die-cutting area in the flip-chip film 100 is an area where the plurality of punch cuts 111A are located. When a die cutting tool is used to cut punch cuts 111 in the die-cutting area of the flip-chip film 100, the die-cutting area completely exposes the substrate 10, so the edge of the wiring during the die cutting process can be directly avoided. Therefore, it effectively avoids the short-circuiting between the metal traces in the bonding area after the flip-chip film unit 11 is bound, and further ensures the stability of the binding area traces after the display panel is bound, thereby further improving the reliability of the display product.

Compared with the flip-chip film in the prior art, the flip-chip film of the present invention is provided with a punch cut between the first metal traces of the two adjacent flip-chip film units. The punch cut cuts off the corresponding first metal traces between two adjacent flip-chip film units. Therefore, when cutting the die-cutting area of the flip-chip film, there is no metal trace at a position corresponding to the punch cut of the flip-chip film, and the probability of metal debris generation during the punching process can be reduced, thereby reducing the risk of short-circuiting between the metal traces in the press-bonding area after the bonding of the flip-chip film units, and improving the reliability of the products.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A flip-chip film, comprising:
a substrate;
a plurality of flip-chip film units, wherein the plurality of flip-chip film units are disposed on the substrate, and each of the flip-chip film units comprises a plurality of first metal traces arranged at intervals; and
a punch cut defined between the first metal traces of two adjacent flip-chip film units, wherein a plurality of punch cuts are connected with each other and arranged side by side, and the substrate is a flexible substrate;
wherein a cutting line is defined on the substrate corresponding to a portion of the punch cut, the cutting line is perpendicular to an extending direction of the first metal trace; and
wherein in a direction parallel to the extending direction of the first metal trace, distances from the cutting line to the first metal traces of the two adjacent flip-chip film units are equal.

2. The flip-chip film according to claim 1, wherein each of the flip-chip film units further comprises at least two second metal traces, the second metal traces and the first metal traces are disposed side by side, and at least one of the first metal traces is disposed between two adjacent second metal traces in each of the flip-chip film units; and
wherein the second metal traces between the two adjacent flip-chip film units are correspondingly connected one to one.

3. The flip-chip film according to claim 2, wherein the first metal traces and the second metal traces are alternately disposed in each of the flip-chip film units.

4. The flip-chip film according to claim 2, wherein the plurality of first metal traces are disposed between the two adjacent second metal traces in each of the flip-chip film units.

5. The flip-chip film according to claim 1, wherein each of the flip-chip film units further comprises a second metal trace, the second metal trace and the first metal trace are disposed side by side, and a plurality of second metal traces are correspondingly connected to each other between the two adjacent flip-chip film units.

6. The flip-chip film according to claim 1, wherein a length of the punch cut ranges from 250 microns to 400 microns in an extending direction of the first metal trace.

7. The flip-chip film according to claim 1, wherein each of the flip-chip film units further comprises a driving chip, a plurality of connection terminals are disposed on the driving chip, and the plurality of connection terminals are correspondingly and electrically connected to each end of the first metal traces.

8. A flip-chip film, comprising:
a substrate;

a plurality of flip-chip film units, wherein the plurality of flip-chip film units are disposed on the substrate, and each of the flip-chip film units comprises a plurality of first metal traces arranged at intervals; and a punch cut defined between the first metal traces of two adjacent flip-chip film units;

wherein a cutting line is defined on the substrate corresponding to a portion of the punch cut, the cutting line is perpendicular to an extending direction of the first metal trace; and wherein in a direction parallel to the extending direction of the first metal trace, distances from the cutting line to the first metal traces of the two adjacent flip-chip film units are equal.

9. The flip-chip film according to claim 8, wherein a plurality of punch cuts are connected with each other and arranged side by side.

10. The flip-chip film according to claim 8, wherein each of the flip-chip film units further comprises at least two second metal traces, the second metal traces and the first metal traces are disposed side by side, and at least one of the first metal traces is disposed between two adjacent second metal traces in each of the flip-chip film units; and wherein the second metal traces between the two adjacent flip-chip film units are correspondingly connected one to one.

11. The flip-chip film according to claim 10, wherein the first metal traces and the second metal traces are alternately disposed in each of the flip-chip film units.

12. The flip-chip film according to claim 10, wherein the plurality of first metal traces are disposed between the two adjacent second metal traces in each of the flip-chip film units.

13. The flip-chip film according to claim 8, wherein each of the flip-chip film units further comprises a second metal trace, the second metal trace and the first metal trace are disposed side by side, and a plurality of second metal traces are correspondingly connected to each other between the two adjacent flip-chip film units.

14. The flip-chip film according to claim 8, wherein a length of the punch cut ranges from 250 microns to 400 microns in an extending direction of the first metal trace.

15. The flip-chip film according to claim 8, wherein each of the flip-chip film units further comprises a driving chip, a plurality of connection terminals are disposed on the driving chip, and the plurality of connection terminals are correspondingly and electrically connected to each end of the first metal traces.

16. The flip-chip film according to claim 8, wherein the substrate is a flexible substrate.

\* \* \* \* \*